United States Patent [19]

Tsuru et al.

[11] Patent Number: 4,842,899

[45] Date of Patent: Jun. 27, 1989

[54] PROCESS FOR FORMING METALLIC FILM ON INORGANIC MATERIAL

[75] Inventors: Yoshiyuki Tsuru; Toshiro Okamura, both of Shimodate; Tetsuya Okishima; Masayoshi Ikeda, both of Katsuta; Masahiro Kawamura, Shimodate, all of Japan

[73] Assignee: Hitachi Chemical Co., Ltd., Tokyo, Japan

[21] Appl. No.: 32,511

[22] Filed: Mar. 31, 1987

[51] Int. Cl.$^4$ .................. C23C 18/22; C23C 18/24
[52] U.S. Cl. ........................... 427/309; 427/305; 156/651
[58] Field of Search ................ 427/309, 305; 156/651

[56] References Cited

U.S. PATENT DOCUMENTS 4,683,168  7/1987  Hares ................... 427/309

Primary Examiner—Sam Silverberg
Attorney, Agent, or Firm—Antonelli, Terry & Wands

[57] ABSTRACT

A metallic film can be formed on a ceramic surface with high adhesive strength by roughening the ceramic surface by (a) dissolving and removing a vitreous substance and (b) roughening a substance constituting mainly a first surface layer, followed by conventional electroless plating.

5 Claims, No Drawings

PROCESS FOR FORMING METALLIC FILM ON INORGANIC MATERIAL

BACKGROUND OF THE INVENTION

This invention relates to a process for forming a metallic film on a surface of an inorganic material such as ceramic useful in the production of printed wiring boards.

As a process for forming a metallic film such as circuit conductors on ceramic substrates, there have been known a so-called thick film method and a so-called thin film method. According to the thick film method, a conductor paste which is a mixture of glass and a metal is printed on a ceramic substrate and baked to form a conductor pattern. This method is advantageous in that strong bonding between the conductor and the ceramic can be obtained by the glass bonding with a relatively inexpensive manner, but disadvantageous in that the conductor resistance is high, the circuit density cannot be enhanced due to printing, and the conductor line shape is bad and unsuitable for high-frequency circuits. On the other hand, according to the thin film method, a metal is cladded on a ceramic substrate by vapor deposition or cathode sputtering. This method is advantageous in that a highly precise conductor pattern can be obtained due to the formation of the circuit pattern by photo etching and thus suitable for high-frequency utility, but disadvantageous in that the production cost is high due to the use of expensive apparatus.

In order to overcome the disadvantges mentioned above, there have been proposed processes for forming copper conductor patterns by conducting electroless plating of copper directly on a ceramic substrate, following by etching, and the like. These processes can be divided into (1) a process comprising treating a surface of a cermaic substrate (particularly an alumina substrate) with borofluoric acid, hydrofluoric acid, or the like to give a roughened surface, and conducting electroless copper plating and electroplating of copper, and (2) a process comprising treating a surface of a ceramic substrate with an alkali to give a roughened surface, and conducting electroless copper plating and electroplating of copper [Japanese Patent Unexamined Publication Nos. 47-11652, 54-82666, 58-104079]. According to process (1), there is a problem in that the adhesive strength between the plated copper and the ceramic is low. On the other hand, the roughening mechanism of ceramic substrate comprises a firsrt step of dissolving a vitreous substance richly distributed on a ceramic surface, a second step of roughening particles which constitute mainly a surface first layer (alumina particles in the case of alumina ceramics), and a third step of roughening and dissolving glass and particles of a second layer. But it is necessary to stop the roughening at the second step. The amount of glass richly distributed on the surface layer changes depending on production lots or manufacturers and the dissolving rate by the alkali is not constant, even if the composition may be the same. Therefore, the process (2) has a problem in that it is difficult to control the roughening amount or roughening time constant.

SUMMARY OF THE INVENTION

It is an object of this invention to provide a process for forming a metallic film having strong adhesive strength by electroless plating on a surface of an inorganic material such as ceramic.

This invention provides a process for forming a metallic film on a surface of an inorganic material which comprises roughening a surface of an inorganic material by (a) dissolving and removing a vitreous substance richly distributed on the surface of the inorganic material, and (b) roughening a substance which constitutes mainly a first surface layer, and conducting conventional electroless plating on the roughened surface of the inorganic material.

DESCRIPTION OF THE PREFERRED EMBODIMENTS

In the roughening of a surface of an inorganic material such as a ceramic substrate, a vitreous substance richly distributed on the surface of the ceramic is dissolved and removed by the step (a) either treating with an inorganic acid which can dissolve and remove only the vitreous substance, for example, borofluoric acid, hydrofluoric acid, etc., or dipping in a molten alkali under the conditions of temperature and time for dissolving and removing only the vitreous substance. For example, in the case of using 46% hydrofluoric acid or 46% borofluoric acid, a ceramic substrate is dipped therein at room temperature for 2 to 10 minutes. In the case of using a molten alkali such as molten NaOH, molten KOH or molten NaOH+KOH (1 : 1 mixture by weight), a ceramic substrate is dipped therein at 250° C. to 400° C. for 10 to 30 minutes.

In order to roughen a substance which constitutes mainly a first surface layer in the step (b), the ceramic substrate subjected to the treatment of the step (a) is dipped in, for example, a molten alkali at high temperatures. For example, there can be used a molten alkali such as NaOH, KOH, or a mixture thereof. The degree of roughening is sufficient when very fine hollows are formed on surfaces of particles of the substance which constitutes mainly a first surface layer. The roughening is stopped at the stage of roughening the substance which constitutes mainly the first surface layer of ceramic substrate.

It is more preferable to roughen the ceramic surface in the range of 0.6 μm to 3 μm in terms of the average roughening depth obtained by dividing the weight loss in surface roughening by the product of a roughened surface area by a density of bulk composition.

It is found that blisters which are formed in a thick metallic film having a thickness of 1 μm or more, preferably 3 μm or more, and obtained by electroless plating after roughening of the ceramic surface with an alkali or the like do not relate to the adhesive strength of the metallic film, and the roughening condition such as the temperature and the period of the alkali roughening, but relate to the average roughening depth obtained by regarding the weight loss in surface roughening as the bulk composition. That is, the average roughening depth (t) obtained by regarding the weight loss in surface roughening as the bulk composition can be represented by the equation:

$$t = w/(S \cdot d)$$

wherein s is the roughened surface area, w is the weight loss in roughening, and d is the density of the bulk composition when the reduced composition is regarded as the bulk composition.

When the surface roughening is conducted so as to make the average roughening depth 0.6 μm to 3 μm by regarding the weight loss by surface roughening as the bulk composition, it is possible to control the metallic film formation so that no blisters are formed in a thick metallic film having a thickness of 1 μm or more, preferably 3 μm or more, during the electroless plating.

The surface roughening can be carried out by alkali roughening such as (i) a process wherein surface roughening is carried out by dipping in an aqueous solution of an alkali metal hydroxide, followed by a heat treatment, or (ii) a process wherein surface roughening is carried out by dipping in a molten alkali metal hydroxide. It is preferable to use the roughening treatment temperature of 400° C. to 600° C.

The surface roughening can also be carried out in combination with roughening with an inorganic acid such as borofluoric acid, hydrofluoric acid, or the like prior to the alkali roughening.

After the surface roughening, the inorganic material such as a ceramic substrate is neutralized, washed with water, and subjected to electroless plating such as electroless copper plating, electroless nickel plating, etc. in a conventional manner to form a metallic film on the ceramic substrate.

According to the process of this invention, it is not necessary to change roughening conditions depending on variation in the amount of vitreous substances on the surface of the inorganic material such as ceramics caused by scatter of production lots or difference in manufacturers. Further, since a stable roughened surface of ceramics can be obtained, it is possible to obtain a metallic film strongly adhered to the ceramic substrate. Moreover, the metallic film with uniform thickness can be formed not only on a flat plate but also on a surface having a complicated shape.

This invention is illustrated by way of the following Example.

EXAMPLE 1

An alumina ceramic plate (Hallox 552, a trade name, mfd. by Hitachi Chemical Co., Ltd., 40 mm long, 60 mm wide, and 0.635 mm thick) was cleaned with a conventional degreasing solution, dried and dipped in a molten NaOH at 350° C. for 10 minutes to carry out roughening. After removing vitreous substances, the alumina ceramic plate was dipped in molten NaOH at 450° C. for 15 minutes for roughening. After neutralizing the alkali, the alumina ceramic plate was washed with water and subjected to electroless copper plating for 15 minutes and electroplating with copper sulfate for 10 minutes. As the electroless copper plating bath, CUST 201 (a trade name, mfd. by Hitachi Chemical Co., Ltd.) was used, and the electroplating with copper sulfate was carried out by using a composition usually used for producing printed wiring boards. After the plating, a pattern of 2 mm×2 mm was formed by etching using a conventional photo resist. The adhesive strength was as good as 2.5 to 4.0 kg/mm$^2$ irrespective of different lots (12 lots).

What is claimed is:

1. A process for forming a metallic film on a surface of a ceramic material which comprises:
    roughening a surface of a ceramic material by the following two-step procedure:
    (a) dissolving and removing a vitreous substance richly distributed on the surface of the ceramic material with an inorganic acid which can dissolve and remove only the vitreous substance, or dipping in a molten alkali under the conditions of temperature and time for dissolving and removing only the vitreous substance, and
    (b) roughening the resulting surface from which the vitreous substance has been removed in a molten alkali to form a roughened first surface layer of the ceramic material, the surface of the ceramic material being roughened in the range of 0.6 μm to 3 μm in terms of an average roughening depth defined by dividing the weight loss and surface roughening by the product of a roughened surface area by a density of a bulk composition, and
    conducting conventional electroless plating on the roughened surface of the ceramic material.

2. A process according to claim 1, wherein the roughening is carried out by dipping the ceramic material in 46% hydrofluoric acid or 46% borofluoric acid for 2 to 10 minutes at room temperature.

3. A process according to claim 1, wherein the roughening is carried out by dipping the ceramic material in molten NaOH, molten KOH or a mixture thereof at 250° C. to 400° C. for 10 to 30 minutes.

4. a process according to claim 1, wherein the ceramic material is an alumina ceramic.

5. A process for roughening a surface of a ceramic surface which consists of the steps of:
    (a) dissolving and removing a vitreous substance richly distributed on the surface of the ceramic substrate with an inorganic acid which can dissolve and remove only the vitreous substance, or dipping in a molten alkali under the conditions of temperature and time for dissolving and removing only the vitreous substance, and
    (b) roughening the resulting surface from which the vitreous substance has been removed in a molten alkali to form a roughened first surface layer of the ceramic substrate, the surface of the ceramic material being roughened in the range of 0.6 μm to 3 μm in terms of an average roughening depth defined by dividing the weight loss and surface roughening by the product of a roughened surface area by a density of a bulk composition.

* * * * *